United States Patent
Kim et al.

(10) Patent No.: US 8,537,628 B2
(45) Date of Patent: Sep. 17, 2013

(54) TEST MODE CONTROL CIRCUIT IN SEMICONDUCTOR MEMORY DEVICE AND TEST MODE ENTERING METHOD THEREOF

(75) Inventors: Byoungsul Kim, Suwon-si (KR); Hakyong Lee, Suwon-si (KR); Jun-Ho Jo, Hwaseong-si (KR); Kyu-Min Park, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 266 days.

(21) Appl. No.: 13/165,823

(22) Filed: Jun. 22, 2011

(65) Prior Publication Data

US 2012/0002494 A1  Jan. 5, 2012

(30) Foreign Application Priority Data

Jul. 5, 2010 (KR) .......... 10-2010-0064407

(51) Int. Cl.
*G11C 7/00* (2006.01)
*G11C 29/00* (2006.01)

(52) U.S. Cl.
USPC ........ 365/201; 365/200; 365/194; 365/233.5; 365/241

(58) Field of Classification Search
USPC ................ 365/201, 200, 194, 233.5, 241
See application file for complete search history.

(56) References Cited

U.S. PATENT DOCUMENTS

| | | | |
|---|---|---|---|
| 5,870,342 A | 2/1999 | Fukuda | |
| 6,400,625 B2 * | 6/2002 | Arimoto et al. | 365/201 |
| 6,636,998 B1 * | 10/2003 | Lee et al. | 714/735 |
| 7,257,754 B2 * | 8/2007 | Chae et al. | 714/738 |
| 7,526,688 B2 * | 4/2009 | Kim | 714/718 |
| 2003/0009713 A1 * | 1/2003 | Endou | 714/724 |

FOREIGN PATENT DOCUMENTS

| | | |
|---|---|---|
| JP | 11-016395 A | 1/1999 |
| JP | 2003-016800 A | 1/2003 |
| KR | 10-0247221 B1 | 12/1999 |
| KR | 10-0329329 B1 | 3/2002 |

* cited by examiner

*Primary Examiner* — Toan Le
(74) *Attorney, Agent, or Firm* — Lee & Morse, P.C.

(57) ABSTRACT

A test mode control circuit is provided to strictly allow entry into a test mode or prevent a boot failure from occurring during a boot operation for a built-in parallel bit test. The test mode control circuit includes a latch, a real entry signal detector, an entry determinator, and a mode control signal generator. When a real entry signal is detected, the entry signal determinator generates an entry determination signal and a test mode control signal is obtained from the mode control signal generator.

20 Claims, 12 Drawing Sheets

TEST MODE CONTROL CIRCUIT IN SEMICONDUCTOR MEMORY DEVICE AND TEST MODE ENTERING METHOD THEREOF

CROSS-REFERENCE TO RELATED APPLICATIONS

This application claims priority under 35 U.S.C. §119 to Korean Patent Application No. 10-2010-0064407, filed on Jul. 5, 2010, in the Korean Intellectual Property Office, and entitled: "Test Mode Control Circuit In Semiconductor Memory Device and Test Mode Entering Method Thereof," which is incorporated by reference herein in its entirety.

BACKGROUND

1. Field

Embodiments relate to semiconductor memory devices and, more particularly, to a test mode control circuit in a semiconductor memory device and a test mode entering method thereof.

2. Description of the Related Art

In a process of fabricating a semiconductor memory device such as a dynamic random access memory (DRAM), the operation of a memory is checked by various tests to guarantee reliability of a product. These tests include an acceleration test performed by applying a high voltage in a high temperature ambient to remove an initial defect and a multi-bit test performed in the unit of a plurality of parallel bits to perform high-speed detection of whether there is a defect in function of a memory cell.

When these tests are conducted, a semiconductor memory device may receive a mode register set command such that a specific operation is performed to improve test efficiency. The specific operation is performed by setting a test mode. The tests are conducted before shipping products and used not by a user but by a semiconductor manufacturing maker. Although an entering condition of the test mode can be accidentally satisfied by a signal noise or mistake while in a user mode, satisfaction of the entering condition of the test mode during a user mode is an unintentional operation mode. There is a need for a more reliable entering condition for entering the test mode.

SUMMARY

One or more embodiments provide a semiconductor memory device that is capable of blocking entry into a test mode during normal use even when there is a noise or a user's mistake.

One or more embodiments may provide a semiconductor memory device that is capable of eliminating or minimizing parallel bit operation entry failure due to a boot failure when a built-in parallel bit (PBT) test is executed.

One or more embodiments may provide a semiconductor memory device where unintentional entry into a test mode is blocked without requiring an additional pin.

One or more embodiments provide a test mode control circuit and a test mode entry method in a semiconductor memory device that inherently blocks entry into a test mode during normal use.

One or more embodiments provide a test mode control circuit and a test mode entry method in a semiconductor memory device that is capable of eliminating or minimizing parallel bit operation entry failure due to a boot failure when a built-in PBT is executed in a data processing system having a cache function.

One or more embodiments provide a test mode control circuit and a test mode entry method in a dynamic random access memory (DRAM) that is capable of preventing invalid TRMS entry during a normal operation and overcoming PBT operation entry failure due to a boot failure during a built-in PBT operation.

One or more embodiments provide a test mode control circuit in a semiconductor memory device, including a latch configured to latch an applied test command, a real entry signal detector configured to detect whether a real entry signal guaranteeing that the test command is a normal command is applied, an entry signal determinator configured to generate an entry determination signal indicating entry into a test mode corresponding to the test command in response to the detection of the real entry signal, and a mode control signal generator configured to generate a test mode control signal in response to a specific address signal when the entry determination signal is activated.

The real entry signal may be one of a pulse signal and a pulse stream signal having a higher level than an operating voltage of the semiconductor memory device.

The real entry signal may be externally applied through a power supply voltage apply terminal.

The real entry signal may be externally applied through data input/output terminals.

The real entry signal may be externally applied through data masking terminals.

The real entry signal detector may include a level detector configured to output a level comparison signal after comparing a level of the real entry signal with a predetermined level of a reference voltage, and an output unit configured to output a real entry detection signal based on the level comparison signal of the level detector.

The entry signal determinator may include an AND gating element configured to generate an AND response by receiving a latched version of the test command and the real entry detection signal.

One or more embodiments may provide a test mode entry method in a semiconductor memory device, the method including latching an applied test command, detecting whether a real entry signal guaranteeing that the test command is a normal command is applied, generating an entry determination signal indicating entry into a test mode corresponding to the test command during the detection of the real entry signal, and generating a test mode control signal in response a specific address signal when the entry determination signal is activated.

The real entry signal may be at least one pulse signal.

The real entry signal may be externally applied through one of a power supply voltage apply terminal, a data input/output terminal, and a data masking terminal.

The specific address signal may be a signal provided from a mode register set circuit.

One or more embodiments may provide a test mode control circuit in a semiconductor memory device, including a latch configured to latch an applied parallel bit test command, a boot completion signal detector configured to detect a boot completion signal applied when a boot operation for a parallel bit test operation is completed, a test entry determinator configured to generate a test entry determination signal indicating entry of the parallel bit test operation corresponding to the parallel bit test command in response to the detection of the boot completion signal, and a test mode control signal generator configured to generate a first test mode control signal according to the parallel bit test command before the boot operation for a parallel bit test operation is completed and generate a second test mode control signal in response to a specific address signal when the parallel bit test entry determination signal is activated.

A write operation may be performed in the semiconductor memory device when the parallel bit test mode control signal generator generates the first test mode control signal.

Both a write operation and a read operation may be performed in the semiconductor memory device when the parallel bit test mode control signal generator generates the second test mode control signal.

The semiconductor memory device may be a dynamic random access memory (DRAM).

The DRAM may be loaded in a portable multimedia device or a data processing system.

The boot completion signal may be externally applied through one of a power supply voltage apply terminal, a data input/output terminal, and a data masking terminal.

The parallel bit test entry determinator may include an AND gating element configured to generate an AND response by receiving a latched version of the parallel bit test command and the boot completion detection signal.

The boot completion detection signal may be at least one positive pulse signal or at least one negative pulse signal.

One or more embodiments may provide a test mode control circuit in a semiconductor memory device, including a latch configured to latch an applied test command, a condition signal detector configured to detect whether a condition-satisfied signal is applied, an entry determinator configured to a generate a test entry determination signal indicating entry into a test operation corresponding to the test command in response to the condition-satisfied signal, and a test mode control signal generator configured to generate at least one test mode control signal in response to a specific address signal when the condition-satisfied signal is activated.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
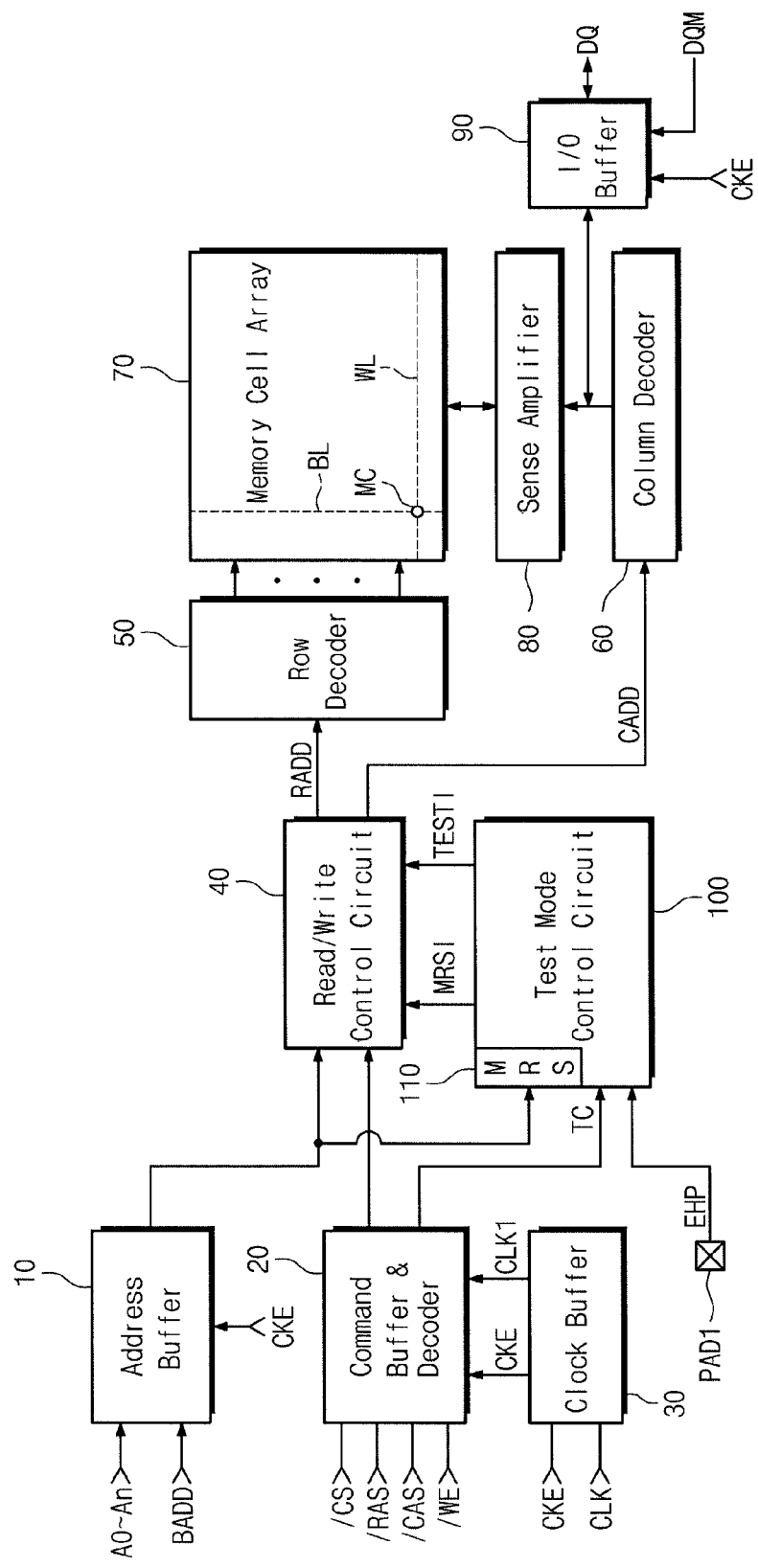
FIG. 1 illustrates a block diagram of an exemplary embodiment of a semiconductor memory device.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when a layer or element is referred to as being "connected to" or "coupled to" another element, the elements may be directly connected or coupled to each other element or one or more intervening elements may be present. It is to be noted that the same or similar reference numerals are applied to the same or similar parts and elements throughout the specification and drawings. In some drawings, connection relationships between an element and lines are merely described for better understanding of the inventive concept and another element or circuit blocks may be further provided.

It is also to be noted that each of the embodiments described and illustrated herein may include complimentary embodiments, and general read and write operations of a dynamic random access memory (DRAM) will be omitted to avoid ambiguous interpretation of the inventive concept.

FIG. 1 illustrates a block diagram of an exemplary embodiment of a semiconductor memory device.

Referring to FIG. 1, the semiconductor memory device may include an address buffer 10, a command buffer and decoder 20, a clock buffer 30, a read/write control circuit 40, a test mode control circuit 100 including a mode register set (MRS) circuit 110, a row decoder 50, a column decoder 60, a memory cell array 70, a sense amplifier 80, and an input/output (I/O) buffer 90.

In embodiments in which the semiconductor device is a synchronous DRAM or a Rambus DRAM, row access time, column access time or burst length may be generally set through the MRS circuit 110. The test mode control circuit 100 including the MRS circuit 110 may set an operation mode of a semiconductor memory device based on the contents of a stored program. In one or more embodiments, the MRS circuit 110 may set a specific operation mode such as a test mode or a parallel bit test mode corresponding to an applied test command.

The clock buffer 30 may output a buffered clock signal CLK1 and a clock enable signal CKE after receiving a clock signal CLK and the clock enable signal CKE.

The address buffer 10 may receive and buffer external address signals A0-An and a bank address signal BADD.

The command buffer and decoder 20 may buffer and decode a chip selection signal /CS, a row address strobe signal /RAS, a column address strobe signal /CAS, and a write enable signal /WE.

The memory cell array 70 may include a plurality of memory cells MC connected to intersections of a plurality of wordlines WL extending in a row direction and a plurality of bitlines BL extending in a column direction. Each of the memory cells MC may be a nonvolatile memory cell including, e.g., one access transistor and one storage capacitor.

The read/write control circuit 40 may control an operation to read stored data from a memory cell MC in the memory cell array 70. The read/write control circuit 40 may write data for writing into the memory cell MC. The read/write control circuit 40 may generate a row address RADD and a column address CADD.

The row decoder 50 may decode the row address RADD to select a row of the memory cell array 70.

The column decoder 60 may decode the column address CADD to select a column of the memory cell array 70.

The sense amplifier 80 may sense and amplify a voltage developed to a bitline to read data stored in a selected memory cell MC of the memory cell array 70.

The I/O buffer 90 may output data read from a memory cell MC through an input/output terminal DQ and may provide data for writing from the input/output terminal DQ to the memory cell MC.

The test mode control circuit 100 may receive a real entry signal EHP through a pad PAD1. The real entry signal EHP may be employed to prevent a semiconductor memory device from unintentionally entering a test mode due to a noise or a user's mistake during normal use. The test mode control circuit 100 may receive a test command TC.

The pad PAD1 may be a power supply pad to which an operation power supply voltage is applied. As a single pad, e.g., the pad PAD1 may be employed for supplying an operation power supply and the real entry signal EHP, embodiments do not require an additional pin for the real entry signal EHP to prevent a semiconductor memory device from unintentionally entering a test mode due to, e.g., noise or a user's mistake during normal use.

Figure 2:
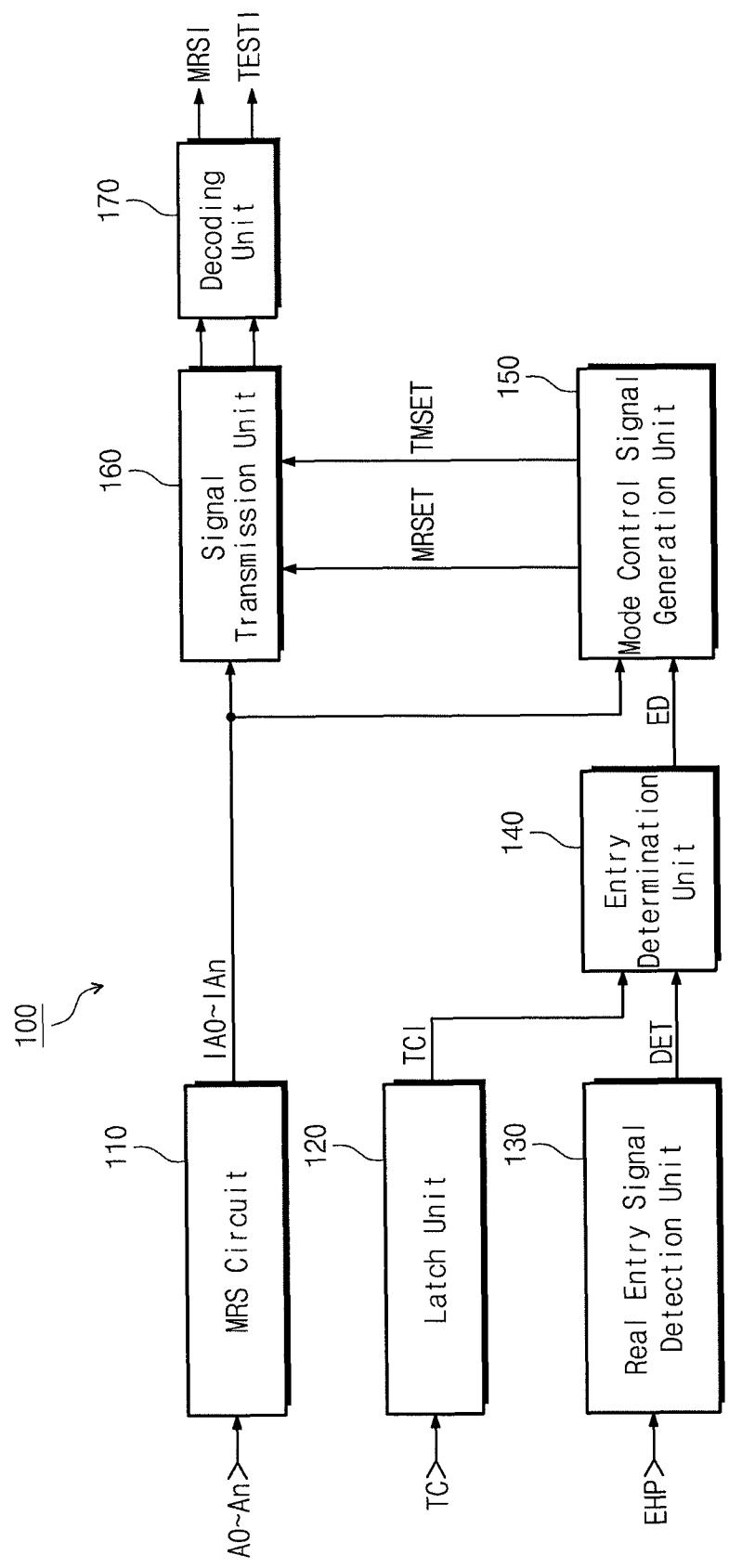
FIG. 2 illustrates a block diagram of an exemplary embodiment of a test mode control circuit shown in FIG. 1.

In one or more embodiments, the test mode control circuit 100 may have the exemplary structure shown in FIG. 2.

FIG. 2 illustrates a block diagram of an exemplary embodiment of a test mode control circuit 100 shown in FIG. 1. As illustrated, the test mode control circuit 100 may include the MRS circuit 110, a latch unit 120, a real entry signal detection unit 130, an entry determination unit 140, and a mode control signal generation unit 150. In one or more embodiments, the test mode control circuit 100 may include a signal transmission unit 160 and a decoding unit 170.

The MRS circuit 110 may receive the buffered external address signals A0-An and may output internal address signal IA0-IAn.

The latch unit 120 may latch an applied test command TC and may output a latched test command TCI.

The real entry signal detecting unit 130 may detect whether a real entry signal EHP, which guarantees that the test command TC is a normal command, is applied.

The entry determination unit 140 may generate an entry determination signal ED in response to detection (DET) of the real entry signal. The entry determination signal ED may indicate entry of a test mode corresponding to the test command TC.

The mode control signal generation unit 150 may generate a test mode control signal TMSET in response to a specific address signal among the internal address signals IA0-IAn when the entry determination signal ED is activated.

The signal transmission unit 160 may transmit the internal address signals IA0-IAn in response to the test mode control signal TMSET and an MRS control signal MRSET of the mode control signal generation unit 150.

The decoding unit 170 may decode the internal address signals IA0-IAn transmitted through the signal transmission unit 160 to generate operation mode control signals MRSI and TESTI. The operation mode control signals MRSI and TESTI may be applied to the read/write control circuit 40 (see, e.g., FIG. 1).

Figure 3:
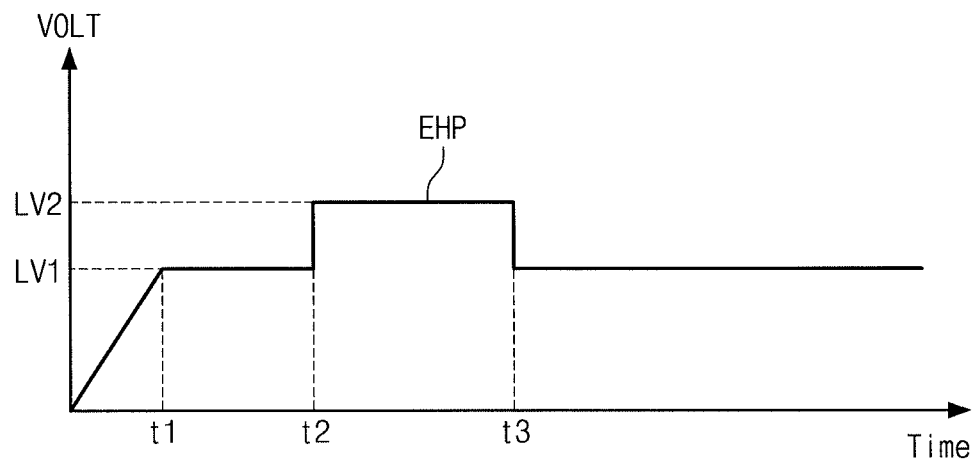
FIG. 3 illustrates a waveform diagram of an exemplary embodiment of a signal employable with the test mode control circuit shown in FIG. 1.

FIG. 3 illustrates a waveform diagram of an exemplary embodiment of a signal employable with the test mode control circuit 100 shown in FIG. 1. In FIG. 3, the horizontal axis represents time and the vertical axis represents a voltage.

Figure 6:
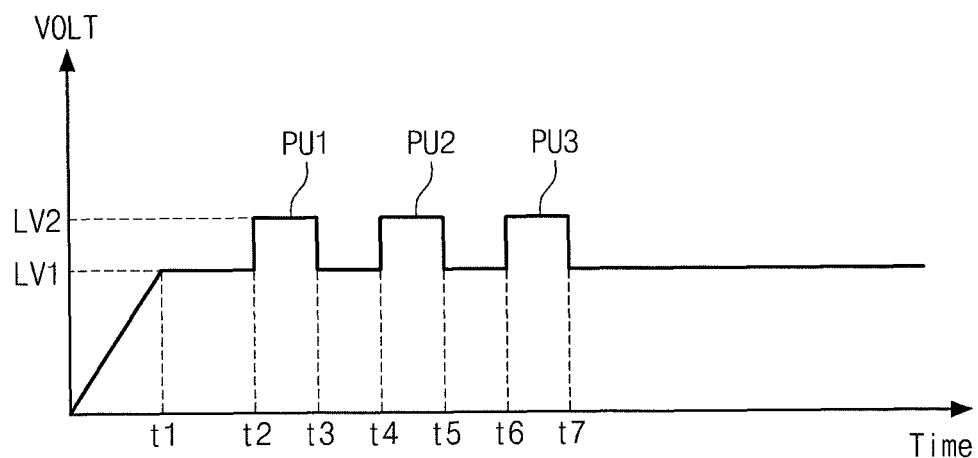
FIG. 6 illustrates a waveform diagram of another exemplary embodiment of a signal employable with the test mode control circuit shown in FIG. 1.

When the real entry signal EHP is applied through the operation power supply voltage pad, the real entry signal EHP may be a pulse signal (see, e.g., FIG. 3) of a higher level than an operation power supply voltage of the semiconductor memory device or a pulse stream signal (see, e.g., FIG. 6). Referring to FIG. 3, the real entry signal EHP may have the shape of a single pulse, as shown between timings t2 and t3. Referring to the vertical axis of FIG. 3, a first level LV1 is a level of the operation power supply voltage and a second level LV2 is higher than the first level LV1. More particularly, e.g., when the first level LV1 is 1.8 volt, the second level LV2 may be set to 2.0 volts to 2.3 volts.

Figure 4:
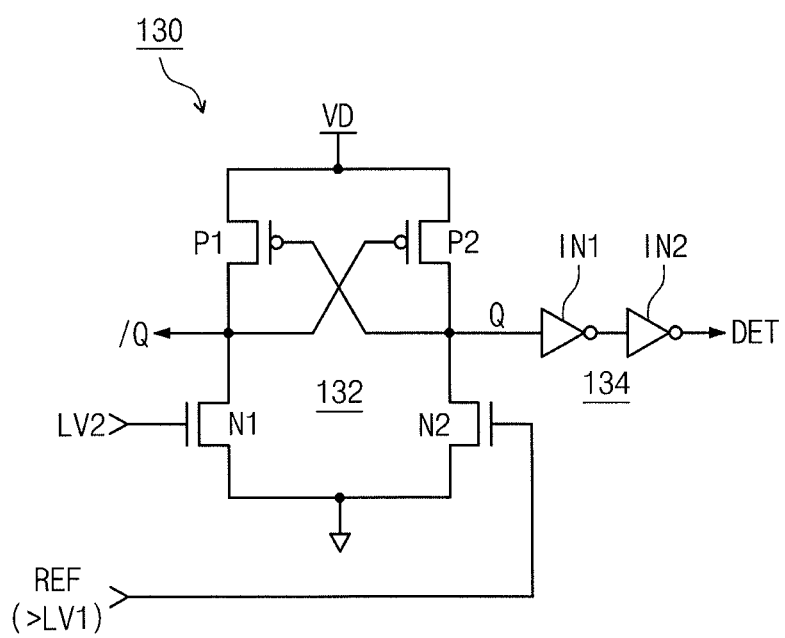
FIG. 4 is illustrates a circuit diagram of an exemplary embodiment of a real entry signal detection unit shown in FIG. 2.

The real entry signal EHP shown in FIG. 3 may be detected by a circuit, e.g., the read entry signal detection unit 130 shown in FIG. 4.

FIG. 4 illustrates a circuit diagram of an exemplary embodiment of the real entry signal detection unit 130 shown in FIG. 2. As illustrated, the real entry signal detection unit 130 may include a level detection unit 132 and an output unit 134.

Referring to FIG. 4, the level detection unit 132 may include P-type MOS transistors P1 and P2 and N-type MOS transistors N1 and N2 constituting a differential amplifier structure such that a level comparison signal is output by comparing the level LV2 of the real entry signal EHP with a predetermined reference voltage level REF(>LV1). The output unit 134 may include inverters IN1, IN2 connected in cascade to an output terminal Q of the level detection unit 132 to buffer the level comparison signal.

Figure 5:
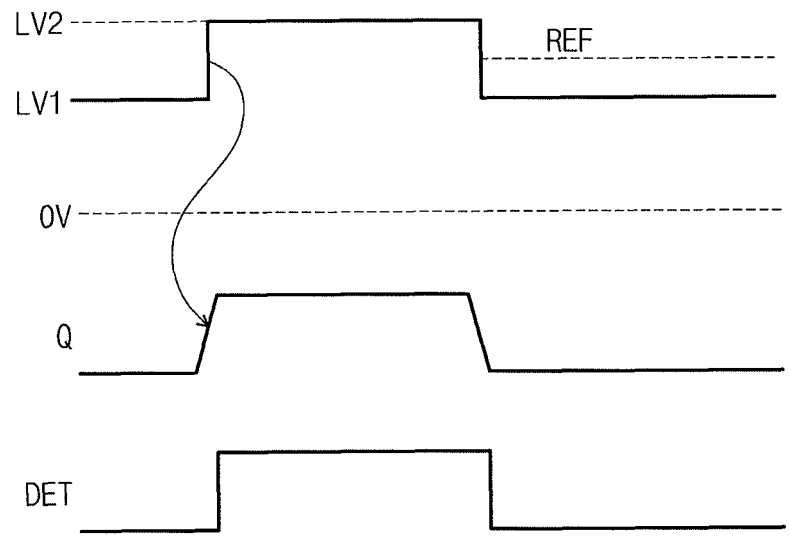
FIG. 5 illustrates a timing diagram of exemplary embodiments of signals employable for operating the real entry signal detection unit shown in FIG. 4.

FIG. 5 illustrates a timing diagram of exemplary embodiments of signals employable for operating the real entry signal detection unit 130 shown in FIG. 4.

Referring to FIGS. 3-5, when the real entry signal EHP is applied as the level LV2, a level comparison signal having the same waveform as a waveform Q may appear at the output terminal Q. The level comparison signal having the same waveform as the waveform Q may be shaped in waveform by the output unit 134. The inverter IN2 may output a real entry detection signal DET having a waveform DET in FIG. 5.

An exemplary operation will now be described in detail with reference to FIGS. 4 and 5. When the reference voltage level REF(>LV1) is applied to a gate of the N-type MOS transistor N2 and a real entry signal EHP having the level LV2 is applied to a gate of the N-type MOS transistor N1, the N-type MOS transistor N1 is turned on more strongly than the N-type MOS transistor N2. This is because the voltage level applied to the gate of the N-type MOS transistor N1 is higher than that applied to the gate of the N-type MOS transistor N2. For this reason, since a voltage at an inverted output terminal /Q of the level detection unit 132 is lower than that at the output terminal Q, the P-type MOS transistor P2 is turned on more strongly than the P-type MOS transistor P1. As a result, if the P-type MOS transistor goes to a fully turn-on state, the voltage level at the output terminal Q is completely distinguished from that at the inverted output terminal /Q. The level comparison signal having the same waveform as the waveform Q is inverted by the inverter IN1 included in the output unit 134 and re-inverted by the back-end inverter IN2. Thus, a real entry detection signal DET having, e.g., the waveform DET in FIG. 5 is obtained at an output terminal of the inverter IN2.

FIG. 6 a waveform diagram of another exemplary embodiment of a signal employable with the test mode control circuit 100 shown in FIG. 1.

In FIG. 6, the horizontal axis represents time and a vertical axis represents a voltage. A pulse stream type signal may include, e.g., three positive pulses PU1, PU2, and PU3. It will be understood that in case of FIG. 6, the real entry detection signal DET appears as three pulse streams due to the pulse PU1 appearing between timings t2 and 3, the pulse PU2 appearing between timings t4 and t5, and the pulse PU3 appearing between timings t6 and t7. Similarly, a first level LV1 shown at the horizontal axis may be a level of the operation power supply voltage and a second level LV2 is higher than the first level LV1. By employing the real entry detection signal DET, one or more embodiments may enable unintentional entry into a test mode to be blocked.

Figure 7:
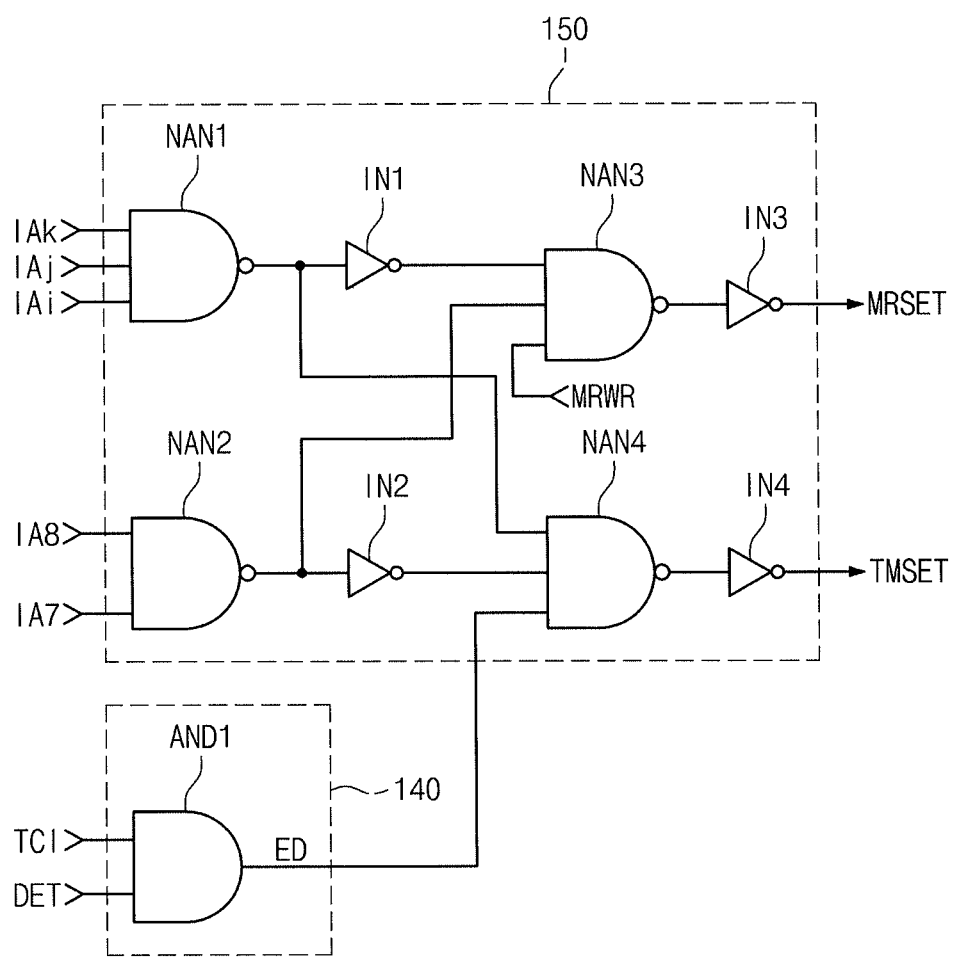
FIG. 7 illustrates a circuit diagram of an exemplary embodiment of a mode control signal generation unit shown in FIG. 2.

FIG. 7 illustrates a circuit diagram of an exemplary embodiment of the mode control signal generation unit 150 shown in FIG. 2.

Referring to FIG. 7, the mode control signal generation unit 150 may include a plurality of NAND gates NAN, a plurality of inverters IN, and an and gate AND. More particularly, a first NAND gate NAN1 may generate a NAND response by receiving address signals IAi, IAj, and IAk associated with a normal node among internal address signals IA0-IAn. A second NAND gate NAN2 may generate a NAND response by receiving address signals IA7 and IA8 associated with a test mode among the internal address signals IA0-IAn. A first inverter IN1 may invert an output of the first NAND gate NAN1. A second inverter IN2 may invert an output of the second NAND gate NAN2. A third NAND gate NAN3 may generate a NAND response by receiving an output of the first inverter IN1, the output of the second NAND gate NAN2, and an MRS write signal MRWR. A fourth NAND gate NAN4 may generate a NAND response by receiving the output of the first NAND gate NAN1 and the entry determination signal ED. A third inverter IN3 may invert an output of the third NAND gate NAN3. A fourth inverter may invert an output of the fourth NAND gate.

In FIG. 7, the entry determination unit 140 may include an AND gate AND1. The entry determination unit 140 may generate an entry determination signal ED.

Referring to FIG. 7, a test mode control signal TMSET output from the fourth inverter IN4 in FIG. 7 is not activated unless the entry determination signal ED is at a logic 'high' level. That is, when the entry determination signal ED applied to the fourth NAND gate NAN4 is at a logic 'low' level, the output of the fourth NAND gate NAN4 becomes a logic 'high' level even if both the address signals IA7 and IA8 associated with the test mode may be rendered to be at a logic 'high' level. Thus, the fourth inverter IN4 connected to the output of the fourth NAND gate NAN4 outputs a test mode control signal TMSET of a logic 'low' level. As a result, in one or more embodiments, even when a test mode entry condition may be satisfied by signal noise, a user's mistake, etc., entry into the test mode is blocked unless the entry determination signal ED is activated.

On the other hand, when the entry determination signal ED is at a logic 'high' level, the output of the fourth NAND gate NAN4 becomes a logic low' level because both the address signals IA7 and IA8 associated with the test mode are rendered to be at a logic 'high' level and one of the address signals IAj, IAk, and IA1 associated with the normal mode is rendered to be at a logic low' level. Thus, a logic 'high' level is applied to three input terminals of the fourth NAND gate NAN4 to make the output of the fourth NAND gate NAN4 low. As a result, the fourth inverter IN4 outputs a test mode control signal TMSET of a logic 'high' level. In one or more embodiments, since this case corresponds to a normal intentional test mode entry condition, entry into the test mode is allowed.

In one or more embodiments, in case of not a test mode but a normal MRS operation mode, the address signals IAj, IAk, and IA1 associated with the normal node are rendered to be at a logic 'high' level and at least one of the address signals IA7 and IA8 associated with the test mode is rendered to be at a logic 'low' level. Therefore, the output of the third NAND gate NAN3 becomes a logic 'low' level when the MRS write signal MRWR is at a logic 'high' level. As a result, an output of the third inverter IN3 connected to an output terminal of the third NAND gate NAN3 becomes a logic 'high' level. In this case, the MRS control signal MRSET is activated high.

Figure 8:
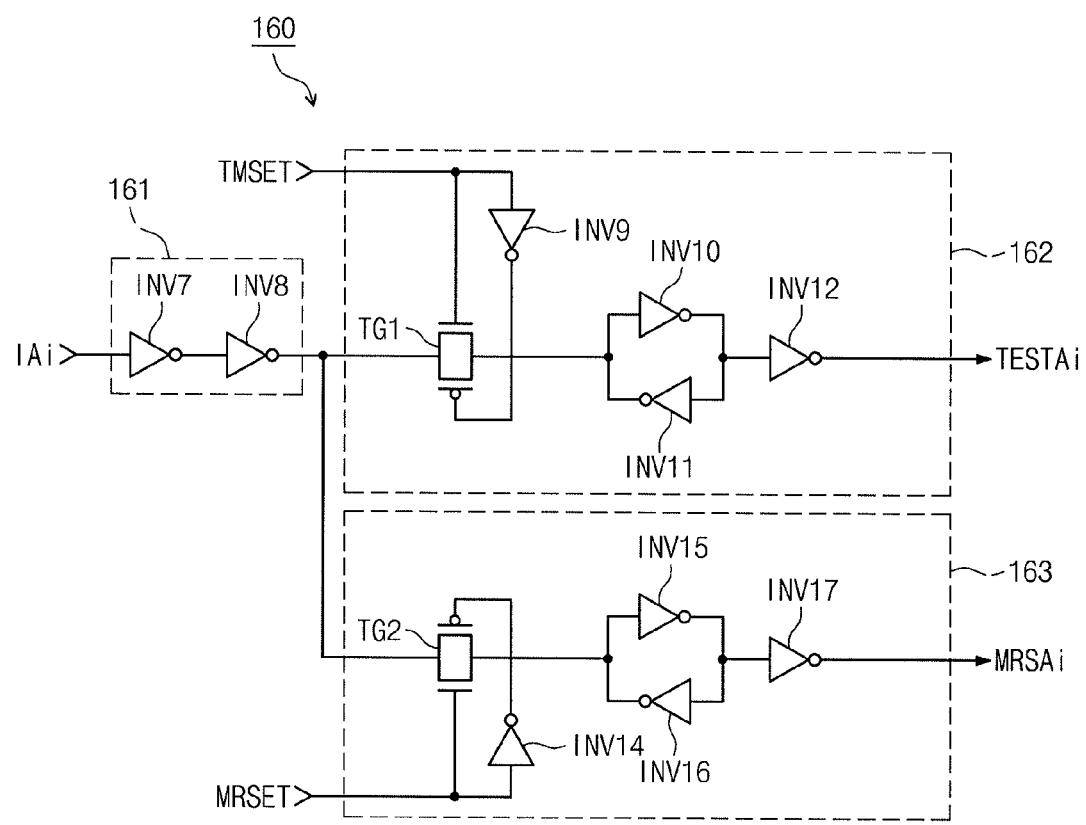
FIG. 8 illustrates a detailed circuit diagram of an exemplary embodiment of a signal transmission unit shown in FIG. 2.

FIG. 8 illustrates a detailed circuit diagram of an exemplary embodiment of the signal transmission unit 160 shown in FIG. 2.

Referring to FIG. 8, the signal transmission unit 160 may include an input buffer unit 161, a first transmission unit 162, and a second transmission unit 163. The signal transmission unit may receive and buffer one of the internal address signals IA0-IAn. The first transmission unit 162 may transmit an output of the input buffer unit 161 in response to the test mode control signal TMSET. The second transmission unit 163 may transmit the output of the input buffer unit 161 in response to the MRS control signal MRSET.

The input buffer unit 161 may include two inverters INV7 and INV8 connected in cascade. The first transmission unit 162 may include a first transmission gate TG1, an inverter INV9, inverters INV10 and INV11 constituting an inverter latch, and an output inverter INV12. The second transmission unit 163 may include a second transmission gate TG2, an inverter INV14, inverters INV15 and INV16 constituting an inverter latch, and an output inverter INV17.

When a logic level of the test mode control signal TMSET is high, an output of the input buffer unit 161 is latched to the inverter latch including the inverter INV10 and INV11 through the first transmission gate TG1. An output of the inverter latch is inverted by the output inverter INV12 and may be output as an internal test address signal TESTAi. When the output bit number of the internal test address signal TESTAi is given by two bits, four kinds of test modes may be selected.

When a logic level of the MRS control signal MRSET is high, the output of the input buffer unit 161 is latched to the inverter latch including the inverters INV15 and INV16 through the second transmission gate TG2. An output of the inverter latch is inverted by the output inverter INV17 and may be output as an internal address signal MRSAi.

In an SDRAM, eight BURST LENGTH modes, two BURST TYPE modes, and five CAS LATENCY modes may be given. Selection of these modes may be done by generation of the internal MRS address signal MRSAi.

Figure 9:
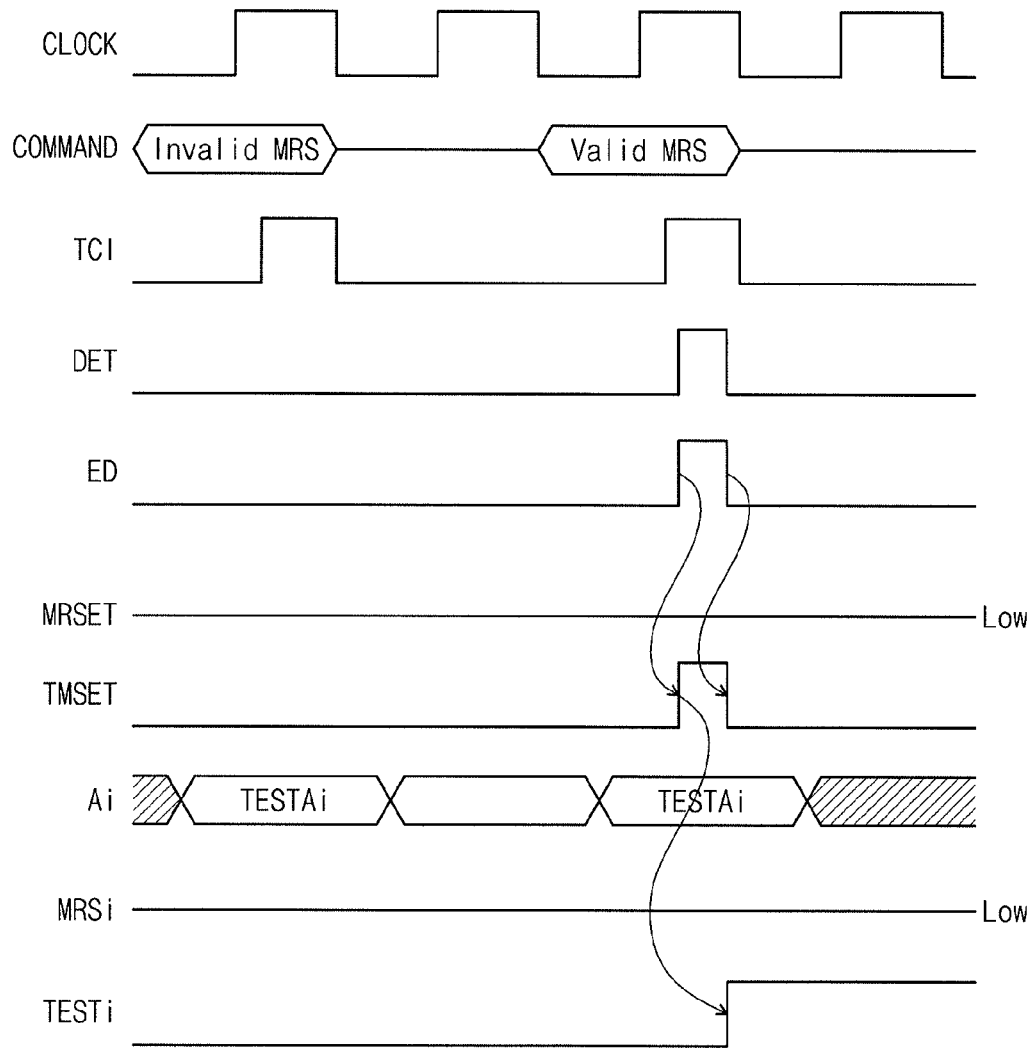
FIG. 9 illustrates a timing diagram of exemplary embodiments of signals employable for operating the test mode control circuit shown in FIG. 2.

FIG. 9 illustrates a timing diagram of exemplary embodiments of signals employable for operating the test mode control circuit 100 of FIG. 2.

Referring to FIG. 9, it will be understood that when the entry determination signal ED transitions to a logic 'high' level, the test mode control signal TMSET also transitions to a logic 'high' level in response thereto and the internal test address mode signal TESTAi is output as a logic 'high' signal.

Figure 10:
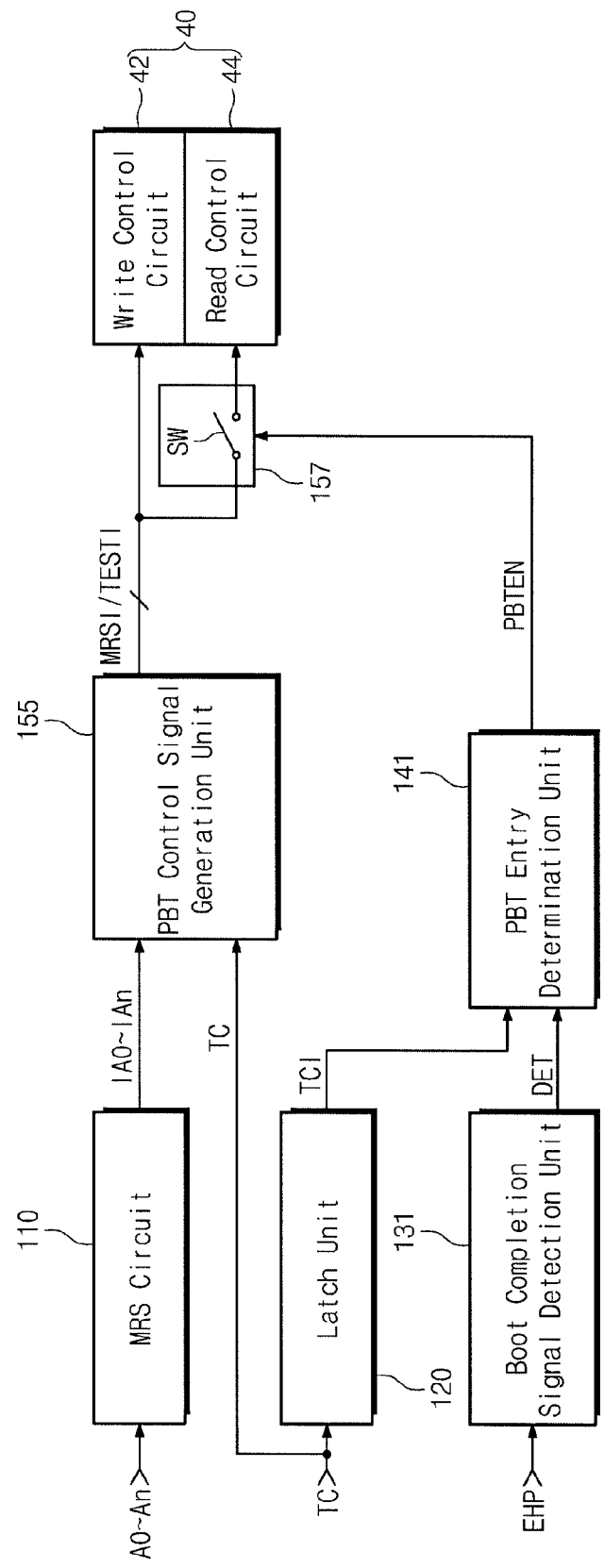
FIG. 10 illustrates a block diagram of another exemplary embodiment of the test mode control circuit shown in FIG. 1.

FIG. 10 illustrates a block diagram of another exemplary embodiment of the test mode control circuit 100 shown in FIG. 1. Referring to FIG. 10, the test mode control circuit 100 may include the MRS circuit 110, the latch unit 120, a boot completion signal detection unit 131, a PBT entry determination unit 141, a PBT control signal generation unit 155, and a switching unit 157.

The MRS circuit 110 may receive buffered external address signals A0-An to generate internal address signal IA0-IAn.

The latch unit 120 may latch an applied parallel bit test command TC and outputs the latched parallel bit test command TCI.

The boot completion signal detection unit 131 may detect a boot completion signal EHP applied when a boot operation for a parallel bit test operation is completed.

The PBT entry determination unit 141 may generate a parallel bit test entry determination signal PBTEN in response to detection (DET) of the boot completion signal. The parallel bit test entry determination signal PBTEN indicates the entry of the parallel bit test operation corresponding to the parallel bit test mode command TC.

A parallel bit test mode control signal generation unit including the PBT control signal generation unit 155 and the switching unit 157 may generate a first test mode control signal (for enabling only a write operation) according to the parallel bit test command TC before the boot operation for the parallel bit test operation is completed, and may generate a second test mode control signal (for enabling only write and read operations) in response to a specific address signal when the parallel bit test entry determination signal PBTEN is activated.

The MRS circuit 110 and the latch unit 120 may be identical in function and configuration to corresponding circuit blocks shown in FIG. 2, respectively. In addition, the boot completion signal detection unit 131 corresponds to the real entry signal detection unit 130 shown in FIG. 2 and the PBT entry determination unit 141 corresponds to the entry determination unit 140 shown in FIG. 2.

Moreover, the PBT control signal generation unit 155 may correspond to a component including the mode control signal generation unit 150 and the signal transmission unit 160 shown in FIG. 2. The decoding unit 170 shown in FIG. 2 may be included in the PBT control signal generation unit 155.

While the mode control signal generation unit 150 of FIG. 2 may directly receive the entry determination signal, in FIG. 10, the PBT control signal generation unit 155 may not directly receive the parallel bit test entry determination signal PBTEN. Referring to FIG. 10, the PBT control signal generation unit 155 is used to control a switch SW of the switching unit 157.

The circuit in FIG. 10 may be employed to prevent an execution of a built-in PBT during a system boot failure in a data processing system having a cache function. One or more embodiments may be configured to block entry into a PBT operation during and/or in response to a boot failure.

A boot failure may occur as a result of, e.g., mismatch of initial data in a parallel bit area during a memory shadowing procedure during booting. In order to prevent occurrence of the boot failure, a read control circuit 44 may be controlled such that a PBT read operation is not performed before booting is completed.

Since the switch SW of the switching unit 157 is closed when the parallel bit test entry determination signal PBTEN is activated after the booting is completed, only a PBT write operation may be performed and an operation for reading data from a memory cell and a comparison operation for comparing the read data with write data may not be performed until the booting is completed. More particularly, a state of the parallel bit test entry determination signal PBTEN may be based on whether booting has been successfully completed. In one or more embodiments, the parallel bit test entry determination signal PBTEN may have a first state for enabling entry into a PBT mode only after booting has been successfully completed, and a second state for preventing entry into a PBT mode, e.g., during an occurrence of boot failure.

More particularly, the procedure of memory shadowing includes a DRAM initialization operation for booting the data processing system on power-up after mounting a DRAM on the data processing system. A data write operation and a data read operation are also performed even in the DRAM initialization operation. In case of mismatch of initial data written into a parallel bit area in a memory cell array, an error is generated at a comparison operation after the data read operation to make the booting difficult. Therefore, in one or more embodiments, since a boot failure prevents entry into a PBT mode, only a data write operation may be performed, i.e., a data read operation may not be performed until a successful boot operation.

Both a write control circuit 42 and the read control circuit 44 shown in FIG. 10 correspond to a read/write control circuit 40.

Figure 11:
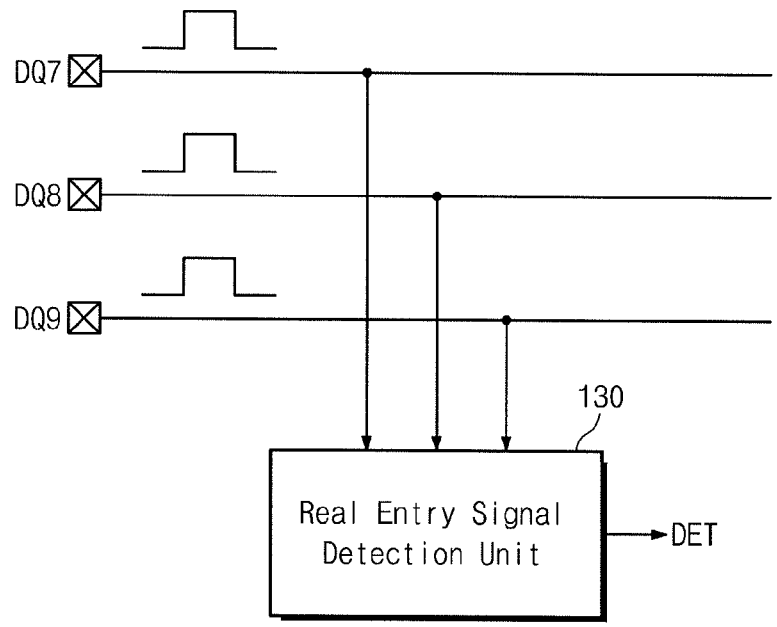
FIGS. 11, 12, and 13 illustrate schematic diagrams of various exemplary embodiments of signal application methods.
Figure 12:
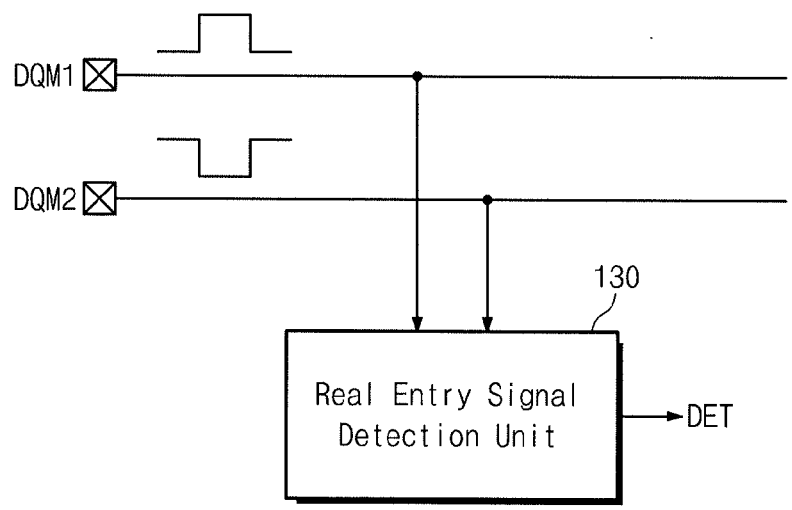
Figure 13:
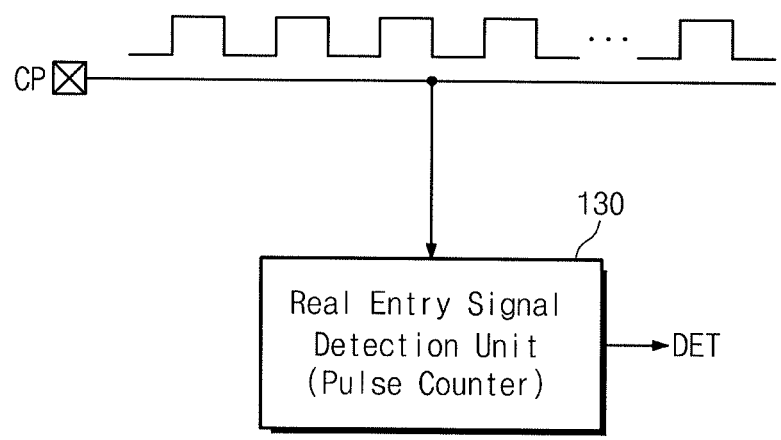

FIGS. 11, 12, and 13 illustrate schematic diagrams of various exemplary embodiments of signal application methods.

Referring to FIG. 11, a real entry signal or a boot completion signal is applied through three data masking terminals DQ7, DQ8, and DQ9 in a pulse shape. When the real entry signal is applied as a boot completion signal, the real entry signal detection unit 130 functions as a boot completion signal detection unit 131 shown in FIG. 10.

Referring to FIG. 12, a real entry signal or a boot completion signal is applied through two data masking terminals DQM1 and DQM2 in a negative pulse shape. When the real entry signal is applied as a boot completion signal, the real entry signal detection unit 130 functions as the boot completion signal detection unit 131 shown in FIG. 10.

Referring to FIG. 13, a real entry signal or a boot completion signal is applied through an unused pad (CP) or a power pad in a pulse stream shape. When the real entry signal is applied as a boot completion signal, the real entry signal detection unit 130 functions as a boot completion signal detection unit 131 shown in FIG. 10. In this case, the real entry signal detection unit 130 may include a pulse counter for counting the number of pulses therein.

Figure 14:
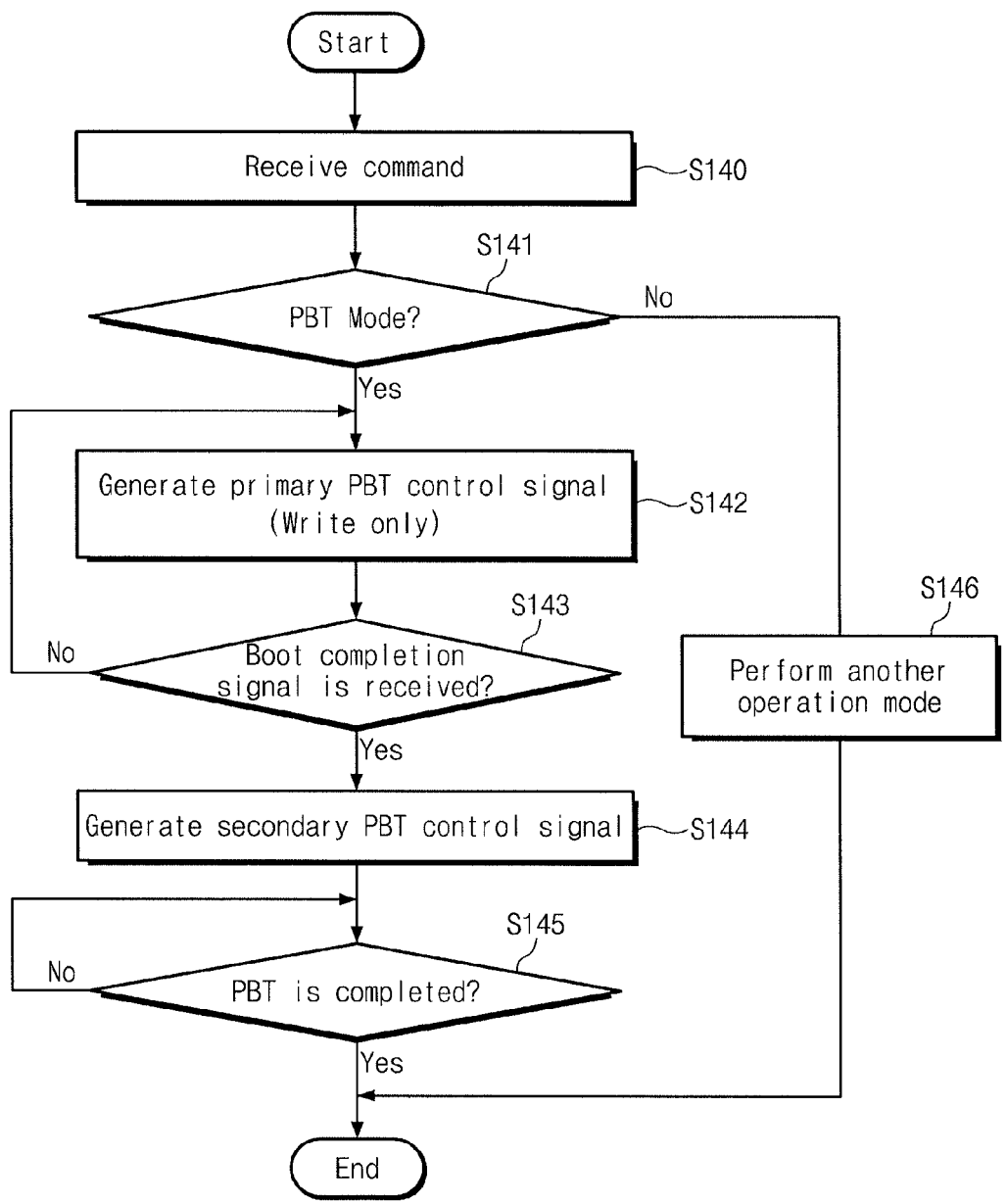
FIG. 14 illustrates a flowchart of an exemplary operation method of the test mode control circuit of FIG. 10.

FIG. 14 illustrates a flowchart of an exemplary operation method of the test mode control circuit of FIG. 10. The operation may begin when a command is received S140. During S140, a command buffer and decoder 20 shown in FIG. 1 may receive a chip selection signal /CS, a row address strobe signal /RAS, a column address strobe signal /CAS, and a write enable signal /WE. If a parallel test command is determined by a decoding operation of the command and buffer decoder 20, S141 may be skipped. If the parallel test mode is checked as a PBT mode, the latch unit 120 (see, e.g., FIG. 10) may receive a parallel bit test command TC. The parallel bit test command may be provided as a signal having a high pulse during a predetermined time period. If S141 is skipped, the operation may proceed to S142 during which the parallel bit test mode control signal generation unit may generate a first test mode control signal. In this case, since a switch SW in a switching unit 157 (see, e.g., FIG. 10) is open, i.e., not closed, only a write control circuit 42 is activated. Thus, only a write operation is performed without performing a read operation after a booting is completed.

During 143, if a boot completion signal is received at a boot completion detection unit 131 (see, e.g., FIG. 10), a PBT entry determination unit 141 may activate a parallel bit entry determination signal PBTEN to a logic 'high' state. Accordingly, the switch SW in the switching unit 157 is closed to activate a read control circuit 44 together with a write control circuit 42. As a result, the flow does not proceed to S144 unless the boot completion signal is received during S143. The boot completion signal may be externally applied through one of a power supply voltage apply terminal, a data input/output terminal, and a data masking terminal. More specifically, since a central processing unit (CPU) or a controller of a data processing system perceives a boot completion state, a boot completion signal may be generated when booting is completed. As a result, during S144, a secondary PBT control signal may be generated. When the parallel bit test mode control signal generation unit generates the secondary test mode control signal, both a write operation and a read operation may be performed in the semiconductor memory device.

During S145, it is checked whether a PBT is completed. If the PBT is completed, the flow comes to an end. During S146, another operation mode is performed when the operation mode is not a PBT mode.

The exemplary operation in FIG. 14 may be performed independently of or in unison with a three-stage safety entry condition. The three-stage safety entry condition is a method where a specific address code is applied throughout three stages to suppress an arbitrary entry into a test mode.

For example, in the case of unisonant use, if a test mode is activated when an internal director detects an externally applied real entry signal even after a three-stage condition is satisfied, entry into a test mode resulting from an unstable condition may be further prevented. Moreover, in the case of the PBT operation mode, upon completion of a successful boot, a stable test mode operation of a built-in memory may be performed normally after writing all data in a parallel bit test area as data that match each other.

Figure 15:
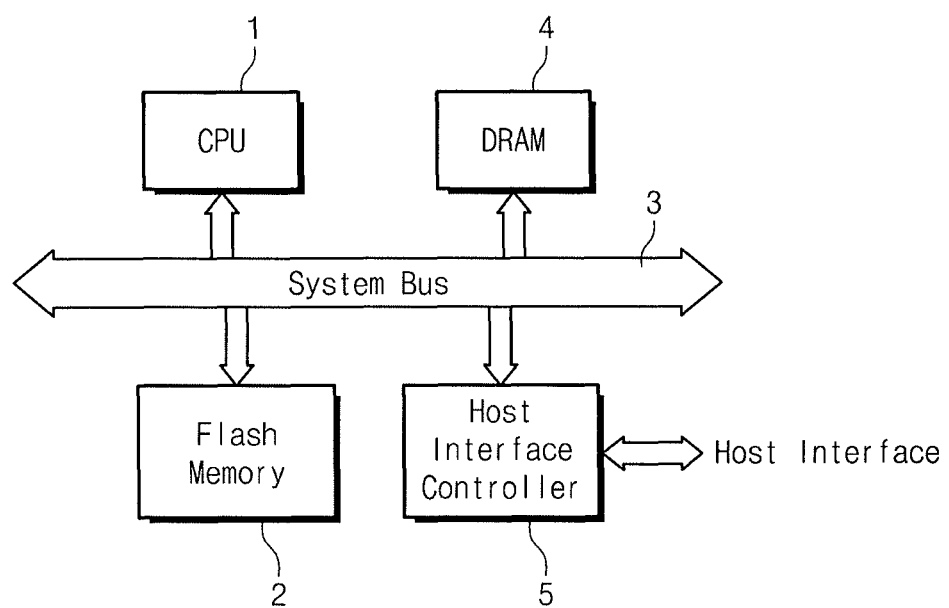
FIG. 15 illustrates a block diagram of an exemplary embodiment of a data processing system.

FIG. 15 illustrates a block diagram of an exemplary embodiment of a data processing system. As illustrated, the data processing system may include a central processing unit (CPU) 1, a dynamic random access memory (DRAM) 4, a system bus 3, a flash memory 2, and a host interface controller 5.

The DRAM 4 may include a test mode control circuit 100, which may have the same configuration the exemplary embodiments shown in FIG. 2 or 10. Accordingly, unintentional entry into a test mode caused by, e.g., noise or a user's mistake may be prevented more surely during normal use. Moreover, one or more embodiments may prevent and/or minimize improper parallel bit test (PBT) operation entry as a result of a boot failure even when a PBT conducted in a built-in memory of a data processing system having a cache function.

One or more embodiments may provide a more reliable entering condition for entering a test mode. In one or more embodiments, a parallel bit test (PBT) mode of a memory that is built in a data processing system may be entered and/or conducted only after successful booting and/or in response to a boot completion signal. One or more embodiments may reduce and/or prevent improper operation of and/or entry into a PBT mode as a result of data mismatch during, e.g., memory shadowing.

One or more embodiments may provide an improved circuit and/or method for preventing a semiconductor memory device from entering a test mode unintentionally and/or by a user as a result of, e.g., noise or user mistake during normal use and/or may provide an improved circuit and/or method for preventing and/or reducing parallel bit test (PBT) operation entry as a result of, e.g., boot failure during operation of a built-in PBT.

In one or more embodiments, the data processing system may function as a mobile device, such as a cellular phone, a personal digital assistant (PDA), a digital camera, a portable game console, and an MP3 player, a notebook computer, etc. Although it is not illustrated, the mobile device may be provided with a battery for supplying an operation voltage required for an operation of the mobile device and a power supply for efficiently using a power of the battery. In addition, the data processing system may include an application chipset and a memory image processor (CIS).

In one or more embodiments, even when test mode entry conditions are satisfied as a result of, e.g., noise, a user's mistake, etc., unless a real entry signal is provided, entry into a test mode will not occur. One or more embodiments may prevent entry into a test mode only when a real entry signal is not provided irrespective of whether the test mode entry conditions are met or not. Thus, one or more embodiments may enable entry into a test mode to be controlled and unintentional entry to be avoided. Moreover, in one or more embodiments, execution of a PBT operation may be blocked during and/or in response to a boot failure of a semiconductor memory device that is built in a data processing system and a built-in parallel bit test (PBT) may only be enabled and/or executed upon completion of a successful boot.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A test mode control circuit in a semiconductor memory device, comprising:
    a latch configured to latch an applied test command;
    a real entry signal detector configured to detect whether a real entry signal guaranteeing that the test command is a normal command is applied;
    an entry signal determinator configured to generate an entry determination signal indicating entry into a test mode corresponding to the test command in response to the detection of the real entry signal; and
    a mode control signal generator configured to generate a test mode control signal in response to a specific address signal when the entry determination signal is activated.

2. The test mode control circuit as claimed in claim 1, wherein the real entry signal is one of a pulse signal and a pulse stream signal having a higher level than an operating voltage of the semiconductor memory device.

3. The test mode control circuit as claimed in claim 1, wherein the real entry signal is externally applied through a power supply voltage apply terminal.

4. The test mode control circuit as claimed in claim 1, wherein the real entry signal is externally applied through data input/output terminals.

5. The test mode control circuit as claimed in claim 1, wherein the real entry signal is externally applied through data masking terminals.

6. The test mode control circuit as claimed in claim 1, wherein the real entry signal detector comprises:

a level detector configured to output a level comparison signal after comparing a level of the real entry signal with a predetermined level of a reference voltage; and an output unit configured to output a real entry detection signal based on the level comparison signal of the level detector.

7. The test mode control circuit as claimed in claim 1, wherein the entry signal determinator comprises:

an AND gating element configured to generate an AND response by receiving a latched version of the test command and the real entry detection signal.

8. A test mode entry method in a semiconductor memory device, the method comprising:

latching an applied test command;

detecting whether a real entry signal guaranteeing that the test command is a normal command is applied;

generating an entry determination signal indicating entry into a test mode corresponding to the test command during the detection of the real entry signal; and generating a test mode control signal in response a specific address signal when the entry determination signal is activated.

9. The test mode entry method as claimed in claim 8, wherein the real entry signal is at least one pulse signal.

10. The test mode entry method as claimed in claim 8, wherein the real entry signal is externally applied through one of a power supply voltage apply terminal, a data input/output terminal, and a data masking terminal.

11. The test mode entry method as claimed in claim 8, wherein the specific address signal is a signal provided from a mode register set circuit.

12. A test mode control circuit in a semiconductor memory device, comprising:

a latch configured to latch an applied parallel bit test command;

a boot completion signal detector configured to detect a boot completion signal applied when a boot operation for a parallel bit test operation is completed;

a test entry determinator configured to generate a test entry determination signal indicating entry of the parallel bit test operation corresponding to the parallel bit test command in response to the detection of the boot completion signal; and a test mode control signal generator configured to generate a first test mode control signal according to the parallel bit test command before the boot operation for a parallel bit test operation is completed and generate a second test mode control signal in response to a specific address signal when the parallel bit test entry determination signal is activated.

13. The test mode control circuit as claimed in claim 12, wherein a write operation is performed in the semiconductor memory device when the parallel bit test mode control signal generator generates the first test mode control signal.

14. The test mode control circuit as claimed in claim 12, wherein both a write operation and a read operation are performed in the semiconductor memory device when the parallel bit test mode control signal generator generates the second test mode control signal.

15. The test mode control circuit as claimed in claim 14, wherein the semiconductor memory device is a dynamic random access memory (DRAM).

16. The test mode control circuit as claimed in claim 15, wherein the DRAM is loaded in a portable multimedia device or a data processing system.

17. The test mode control circuit as claimed in claim 12, wherein the boot completion signal is externally applied through one of a power supply voltage apply terminal, a data input/output terminal, and a data masking terminal.

18. The test mode control circuit as claimed in claim 17, wherein the parallel bit test entry determinator comprises:

an AND gating element configured to generate an AND response by receiving a latched version of the parallel bit test command and the boot completion detection signal.

19. The test mode control circuit as claimed in claim 18, wherein the boot completion detection signal is at least one positive pulse signal or at least one negative pulse signal.

20. A test mode control circuit in a semiconductor memory device, comprising:

a latch configured to latch an applied test command;

a condition signal detector configured to detect whether a condition-satisfied signal is applied;

an entry determinator configured to a generate a test entry determination signal indicating entry into a test operation corresponding to the test command in response to the condition-satisfied signal; and a test mode control signal generator configured to generate at least one test mode control signal in response to a specific address signal when the condition-satisfied signal is activated.

* * * * *